United States Patent [19]

Tanaka et al.

[11] Patent Number: 5,016,258

[45] Date of Patent: May 14, 1991

[54] DIGITAL MODULATOR AND DEMODULATOR

[75] Inventors: Shinichi Tanaka, Kyoto; Hiromichi Ishibashi, Toyonaka; Akira Matsubara Takatsuki; Tsuyoshi Okada, Yokohama, all of Japan

[73] Assignee: Matsushita Electric Industrial Co., Ltd., Osaka, Japan

[21] Appl. No.: 363,987

[22] Filed: Jun. 9, 1989

[30] Foreign Application Priority Data

Jun. 10, 1988 [JP] Japan ................... 63-144261
Jul. 8, 1988 [JP] Japan ................... 63-171280

[51] Int. Cl.$^5$ ................... H04L 15/00; H03M 7/20
[52] U.S. Cl. ................... 375/25; 371/55; 341/58; 341/95; 341/102
[58] Field of Search ................... 371/55, 56; 375/17, 375/19, 25; 341/58, 95, 102

[56] References Cited

U.S. PATENT DOCUMENTS

| | | |
|---|---|---|
| 3,689,899 | 9/1972 | Franaszek . |
| 3,913,093 | 10/1975 | DeVincentiis ................... 375/19 |
| 4,020,282 | 4/1977 | Halpern ................... 341/58 |
| 4,358,852 | 11/1982 | Ichikawa et al. ................... 375/25 |
| 4,538,203 | 4/1986 | Monk ................... 369/189 |
| 4,573,034 | 2/1986 | Immink . |
| 4,598,326 | 7/1986 | Leiner ................... 360/40 |
| 4,599,717 | 7/1986 | Bracht et al. ................... 369/54 |
| 4,606,016 | 8/1986 | Verboom et al. ................... 369/54 |
| 4,620,311 | 10/1986 | Immink ................... 375/19 |
| 4,646,281 | 2/1987 | Verboom et al. ................... 369/59 |
| 4,802,154 | 1/1989 | Verboom et al. ................... 369/59 |
| 4,855,742 | 8/1989 | Verboom ................... 341/102 |

FOREIGN PATENT DOCUMENTS 0138229 4/1985 European Pat. Off. .
0150082 7/1985 European Pat. Off. .
0154389 9/1985 European Pat. Off. .

OTHER PUBLICATIONS

"Introduction to Digital Audio Recording", F. A. Bellis; The Radio and Electronic Engineer, vol. 53, No. 10, Oct. 1983, pp. 361-368.

*Primary Examiner*—Benedict V. Safourek
*Assistant Examiner*—Young T. Tse
*Attorney, Agent, or Firm*—Wenderoth, Lind & Ponack

[57] ABSTRACT

A digital modulator converts M-bit data words to N-bit code words (N>M) each containing a specific number of bits '1'. The specific number is one of a plurality of predetermined numbers which are different by at least 3 from one another. A specific data word may be converted to either one of two code words having different numbers of bits '1' from each other so as to reduce DC components of a channel code constituted by the code words.

11 Claims, 10 Drawing Sheets

| | $W_1$ | $W_2$ | $W_3$ | $W_4$ | $W_5$ | $W_6$ |
|---|---|---|---|---|---|---|
| DATA WORD | 00101001 | 11011010 | 00000000 | 10011010 | 11111110 | 00011000 |
| CODE WORD | 0010100111 | 1101101000 | 0000011000 | 1001101001 | 1100111111 | 011101010 |

FIG. 3

| \multicolumn{8}{c|}{INPUT WORD} | \multicolumn{7}{c}{OUTPUT WORD} |

| $b_7$ | $b_6$ | $b_5$ | $b_4$ | $b_3$ | $b_2$ | $b_1$ | $b_0$ | $S_8$ | $S_7$ | $S_6$ | $S_5$ | $S_4$ | $S_3$ | $S_2$ |
|---|---|---|---|---|---|---|---|---|---|---|---|---|---|---|
| 0 | 0 | 0 | 0 | 0 | 0 | 1 | 0 | 0 | 0 | 0 | 1 | 1 | 1 | 1 |
| 0 | 0 | 0 | 0 | 0 | 0 | 1 | 1 | 0 | 0 | 1 | 0 | 1 | 1 | 1 |
| 0 | 0 | 0 | 0 | 0 | 1 | 0 | 0 | 0 | 0 | 1 | 1 | 0 | 1 | 1 |
| 0 | 0 | 0 | 0 | 0 | 1 | 0 | 1 | 0 | 0 | 1 | 1 | 1 | 0 | 1 |
| 0 | 0 | 0 | 0 | 0 | 1 | 1 | 0 | 0 | 0 | 1 | 1 | 1 | 1 | 0 |
| 0 | 0 | 0 | 0 | 1 | 0 | 0 | 0 | 0 | 1 | 0 | 0 | 1 | 1 | 1 |
| 0 | 0 | 0 | 0 | 1 | 0 | 0 | 1 | 0 | 1 | 0 | 1 | 0 | 1 | 1 |
| 0 | 0 | 0 | 0 | 1 | 0 | 1 | 0 | 0 | 1 | 0 | 1 | 1 | 0 | 1 |
| 0 | 0 | 0 | 0 | 1 | 1 | 0 | 0 | 0 | 1 | 0 | 1 | 1 | 1 | 0 |
| 0 | 0 | 0 | 1 | 0 | 0 | 0 | 0 | 0 | 1 | 1 | 0 | 0 | 1 | 1 |
| 0 | 0 | 0 | 1 | 0 | 0 | 0 | 1 | 0 | 1 | 1 | 0 | 1 | 0 | 1 |
| 0 | 0 | 0 | 1 | 0 | 0 | 1 | 0 | 0 | 1 | 1 | 0 | 1 | 1 | 0 |
| 0 | 0 | 0 | 1 | 0 | 1 | 0 | 0 | 0 | 1 | 1 | 1 | 0 | 0 | 1 |
| 0 | 0 | 0 | 1 | 1 | 0 | 0 | 0 | 0 | 1 | 1 | 1 | 0 | 1 | 0 |
| 0 | 0 | 1 | 0 | 0 | 0 | 0 | 0 | 0 | 1 | 1 | 1 | 1 | 0 | 0 |
| 0 | 0 | 1 | 0 | 0 | 0 | 0 | 1 | 1 | 0 | 0 | 0 | 1 | 1 | 1 |
| 0 | 0 | 1 | 0 | 0 | 0 | 1 | 0 | 1 | 0 | 0 | 1 | 0 | 1 | 1 |
| 0 | 0 | 1 | 0 | 0 | 1 | 0 | 0 | 1 | 0 | 0 | 1 | 1 | 0 | 1 |
| 0 | 0 | 1 | 0 | 1 | 0 | 0 | 0 | 1 | 0 | 0 | 1 | 1 | 1 | 0 |
| 0 | 0 | 1 | 1 | 0 | 0 | 0 | 0 | 1 | 0 | 1 | 0 | 0 | 1 | 1 |
| 0 | 1 | 0 | 0 | 0 | 0 | 0 | 0 | 1 | 0 | 1 | 0 | 1 | 0 | 1 |
| 0 | 1 | 0 | 0 | 0 | 0 | 0 | 1 | 1 | 0 | 1 | 0 | 1 | 1 | 0 |
| 0 | 1 | 0 | 0 | 0 | 0 | 1 | 0 | 1 | 0 | 1 | 1 | 0 | 0 | 1 |
| 0 | 1 | 0 | 0 | 0 | 1 | 0 | 0 | 1 | 0 | 1 | 1 | 0 | 1 | 0 |
| 0 | 1 | 0 | 0 | 1 | 0 | 0 | 0 | 1 | 0 | 1 | 1 | 1 | 0 | 0 |
| 0 | 1 | 0 | 1 | 0 | 0 | 0 | 0 | 1 | 1 | 0 | 0 | 0 | 1 | 1 |
| 0 | 1 | 1 | 0 | 0 | 0 | 0 | 0 | 1 | 1 | 0 | 0 | 1 | 0 | 1 |
| 1 | 0 | 0 | 0 | 0 | 0 | 0 | 0 | 1 | 1 | 0 | 0 | 1 | 1 | 0 |
| 1 | 0 | 0 | 0 | 0 | 0 | 0 | 1 | 1 | 1 | 0 | 1 | 0 | 0 | 1 |
| 1 | 0 | 0 | 0 | 0 | 0 | 1 | 0 | 1 | 1 | 0 | 1 | 0 | 1 | 0 |
| 1 | 0 | 0 | 0 | 0 | 1 | 0 | 0 | 1 | 1 | 0 | 1 | 1 | 0 | 0 |
| 1 | 0 | 0 | 0 | 1 | 0 | 0 | 0 | 1 | 1 | 1 | 0 | 0 | 0 | 1 |
| 1 | 0 | 0 | 1 | 0 | 0 | 0 | 0 | 1 | 1 | 1 | 0 | 0 | 1 | 0 |
| 1 | 0 | 1 | 0 | 0 | 0 | 0 | 0 | 1 | 1 | 1 | 0 | 1 | 0 | 0 |
| 1 | 1 | 0 | 0 | 0 | 0 | 0 | 0 | 1 | 1 | 1 | 1 | 0 | 0 | 0 |

FIG. 4

| DATA WORD | | | | | | | | P | $b_0$ | CODE WORD | | | | | | | | | |
|---|---|---|---|---|---|---|---|---|---|---|---|---|---|---|---|---|---|---|---|
| MSB | | | | | | | LSB | | | $y_9$ | $y_8$ | $y_7$ | $y_6$ | $y_5$ | $y_4$ | $y_3$ | $y_2$ | $y_1$ | $y_0$ |
| 0 | 0 | 0 | 0 | 0 | 0 | 0 | 0 | 0 | 0 | 0 | 0 | 0 | 0 | 0 | 1 | 1 | 0 | 0 | 0 |
| 0 | 0 | 0 | 0 | 0 | 0 | 0 | 1 | 0 | 1 | 0 | 0 | 0 | 0 | 1 | 1 | 0 | 0 | 0 | 0 |
| 1 | 1 | 1 | 1 | 1 | 1 | 1 | 1 | 1 | 0 | 0 | 0 | 0 | 1 | 1 | 0 | 0 | 0 | 0 | 0 |
| 1 | 1 | 1 | 1 | 1 | 1 | 1 | 0 | 1 | 1 | 0 | 0 | 1 | 1 | 0 | 0 | 0 | 0 | 0 | 0 |

FIG. 6 →

| | $W_1$ | $W_2$ | $W_3$ | $W_4$ | $W_5$ | $W_6$ |
|---|---|---|---|---|---|---|
| DATA WORD | 00101001 | 11011010 | 00000000 | 10011010 | 11111110 | 00011000 |
| CODE WORD | 0010100111 | 1101101000 | 0000011000 | 1001101001 | 1100111111 | 011101010 |

DIGITAL MODULATOR AND DEMODULATOR

BACKGROUND OF THE INVENTION

1. Field of the Invention

The present invention relates to a digital modulator for converting a binary data to a channel code suitable for recording or transmission and a demodulator for converting the channel code back to the original binary data.

2. Description of the Prior Art

For the purpose of improvement in digital recording and digital communication, there has recently been utilized a digital modulator for performing a process known as group coding. The group coding divides data bits into groups and converts each group to a channel code. The group coding can improve the efficiency of coding, and allows for self-clocking.

As a digital modulation method of group coding, a (2,7) code method is disclosed in U.S. Pat. No. 3,689,899. This digital modulation method allows data bits composed of 2-, 3-, and 4-bit units to be converted into channel bits of 4-, 6-, and 8-bit units respectively. More specifically, the channel bits will contain 2 to 7 bits '0' between bits '1'.

Thus, the (2,7) code method is successfully used in the magnetic recording with the help of NRZI recording which involves a state transition at every channel bit '1'. Particularly, the interval of state transitions is represented by at least 1.5 data bits and becomes 1.5 times greater than that in the NRZI recording without code conversion, which will probably increase the density of recording 1.5 times. However, in optical recording, the NRZI recording is hardly effected due to a change in the duty ratio of the record signal. RZ recording is therefore employed in which a pulse mark having a particular width is given at each channel bit '1'. In this case, the mark length will be 0.75 times greater than the data bit length. The problem is that optical recording using the (2,7) code is disadvantageous for increasing the recording density as compared with magnetic recording. Also, as the number of channel bits is 2 times greater than that of data bits, the width of the channel bit becomes narrower and the jitter margin will be reduced.

U.S. Pat. No. 4,646,281 discloses a process named as four out of fifteen code (4/15 code) for demodulating a channel signal demodulated by group coding. In the 4/15 code method, an 8-bit data word is converted to a 15-bit code word in which the number of '1's contained is limited to 4. Accordingly, a method of differential detection can be used when the code word is read out from a channel signal supplied from a transmission path. The differential detection is a procedure of detecting a code word in which, if '1' is high in the level and '0' is low, the channel signal is sampled in synchronism with the channel bits, and the first through fourth largest samples are each designated as '1' and the remaining samples are each designated as '0'. The advantage of the differential detection is that the noise margin will increase. However, as an 8-bit data word is converted to a 15-bit code word, the length of each bit decreases and thus, the jitter margin will be reduced. The reason for assigning the large number of bits, i.e. 15 bits, to the code word is to keep the number of bits '0' occurring between bits of '1' to more than one so that the minimum distance between transitions will not become small. Hence, the minimum transition interval is equivalent to 0.8 times the data bit length.

When an M-bit data word is converted to an N-bit code word in which N>M, the jitter margin will increase as the ratio of N/M becomes smaller. For execution of the differential detection, a rule of conversion should be determined so that the number of '1's contained in the code word is always a specific number i. The minimum of N in the code word converted from the M-bit data word under the abovementioned condition is determined naturally. Table 1 shows the relations among M, N and i.

TABLE 1

| M | 4 | 5      | 6 | 7      | 8      | 9      | 10     |
|---|---|--------|---|--------|--------|--------|--------|
| N | 6 | 7      | 8 | 10     | 11     | 12     | 13     |
| i | 3 | 3 or 4 | 4 | 4 to 6 | 4 to 6 | 5 to 7 | 5 to 8 |

The numeral i is determined from $$_NC_i \geqq 2^M$$

where N is the minimum number corresponding to M. For example, if M is 8, the number of bits in the code word (N) is 11 and the jitter margin is greater than that of the 4/15 code. However, the minimum transition interval is 0.73 times the data bit length and shorter than that of the 4/15 code.

SUMMARY OF THE INVENTION

It is an object of the present invention to provide a digital modulator for generating a channel code from which code words can be reproduced through the differential detection with a great noise margin and which has a jitter margin greater than that of the prior art without shortening the minimum transition interval, and a demodulator for reproduction of the original data by reading the channel code.

A digital modulator according to the present invention converts M-bit data words into N-bit code words, where N>M, in which each N-bit code word is classified into one of a plurality of groups according to the number of '1's contained in the N-bit code word, and where the numbers of '1's in code words classified into different groups differ from each other at least 3. In other words, the number of bits '1' contained in each code word is different by at least 3 from that of another code word. A plurality of code words thus obtained constitute a channel code, which is outputted as a channel signal.

A demodulator for demodulating a channel code created in the abovementioned procedure, classifies an input channel signal into one of a plurality of groups according to the number of '1's contained in each code word, and designates a predetermined number of bits selected in turn from the highest likelihood as '1' so that each code word contains a corresponding number of '1's to the classified group. The code words in different groups become different in the number of '1's by at least 3 from each other, which will increase the reliability in the classification. The differential detection also can be carried out in each group for having obtaining a great noise margin.

The conventional digital modulators arranged for execution of the differential detection allow each code word to contain only a unique number of '1's. According to the present invention, however, the number of '1's containable in a code word is not limited to only one kind, so that it is possible to reduce the number of bits per code word. Table 2 shows an arrangement example in which an M-bit data word is converted into an N-bit code word which may have either one of two kind of numbers of '1's, i and j which are different from each other by at least 3.

TABLE 2

| M | 7 | 8 | 10 |
|---|---|---|---|
| N | 9 | 10 | 12 |
| i | 4 | 5 | 6 |
| j | 1 | 2 | 3 |

The relation among M, N, i and j is expressed as:

$$_NC_i + {_NC_j} \geq 2^M$$

As compared with Table 1, N is reduced by 1 in relation to each value of M when the number of bits, M, of the data word is 7 or more. As a result, the conversion to a code word can be made with efficiency and also, an input channel signal can be read with precision. However, since the disparity of '1' and '0' is different between the two code words having an i number of '1's and a j number of '1's and the DC component will vary according to the data word, the DC component should be regenerated for the demodulation.

It is possible to have a so-called DC-free channel code, of which DC component does not vary with the data word, by permitting some data words to correspond to code words each having i number of '1's and each of the other remaining data words to a pair of code words having j number of '1's, $j \geq i-3$ and k number of '1's, $k \geq i+3$. More specifically, during the conversion of each of the remaining data words, one of the pair of code words can be selected to eliminate drift of the DC component.

Preferably, with M=8, N=10, i=5, j=2, and k=8, the process in bit unit can be facilitated and the conversion will be executed with high efficiency using a comparatively simple procedure.

The demodulator is arranged in which the channel signal is binary coded by a plurality of comparators having different threshold levels, but not sampled and processed by differential detection. Then, a maximum likelihood among the binary coded signals is designated as a code word. Accordingly, in this manner, high-speed processing will be possible.

BRIEF DESCRIPTION OF THE DRAWINGS

FIG. 3 is a chart of a first encoding table utilized in the digital modulator of FIG. 1.

FIG. 4 is a chart of a second encoding table utilized in the digital modulator of FIG. 1.

FIG. 6 is a chart showing a process of conversion for the operation of, the digital modulator of FIG. 1.

DESCRIPTION OF THE PREFERRED EMBODIMENT

Figure 1:
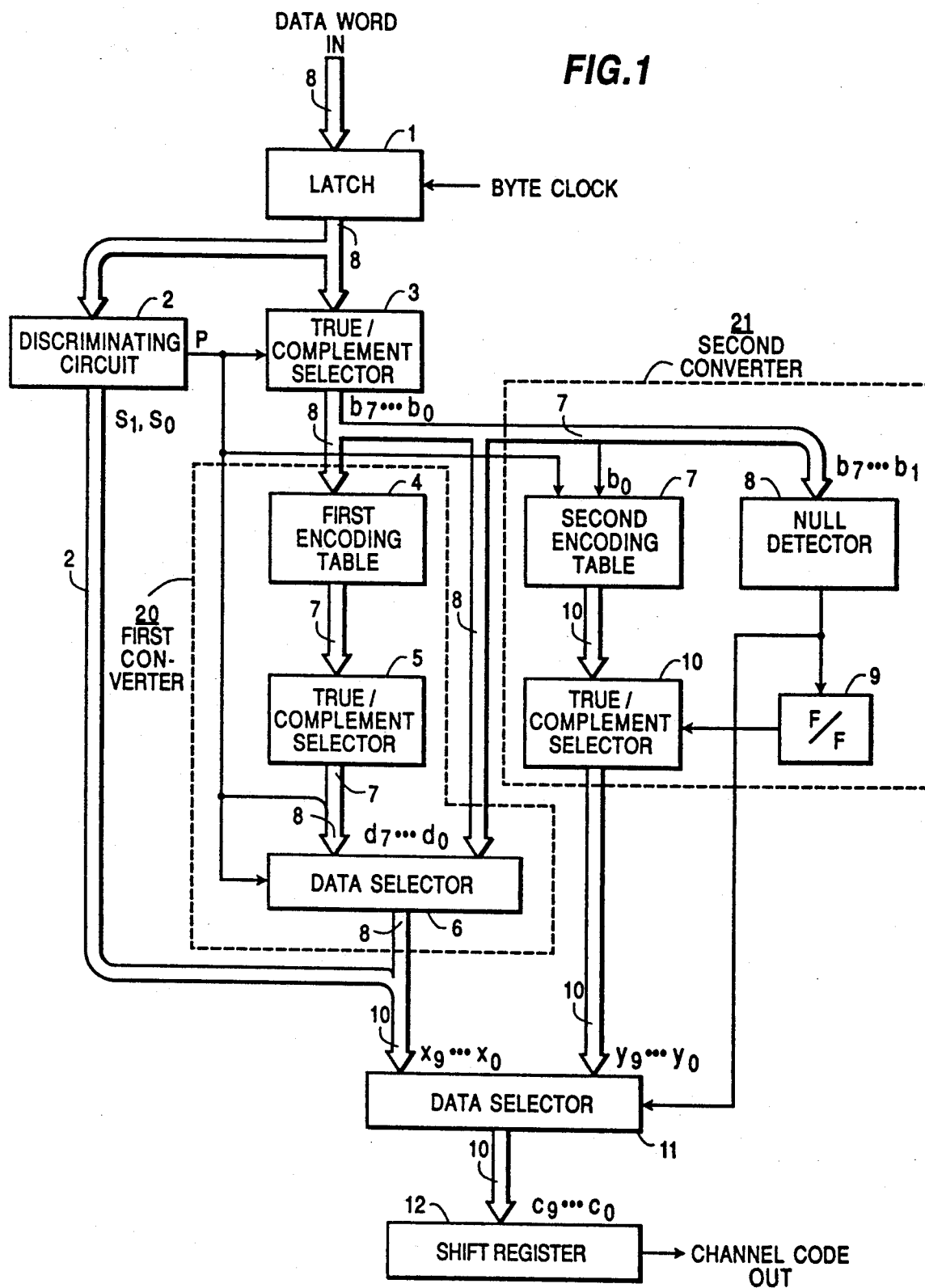
FIG. 1 is a block diagram of a digital modulator showing a preferred embodiment of the present invention.

FIG. 1 is a block diagram showing an arrangement of a digital modulator according to the present invention. As shown in FIG. 1, the digital modulator comprises a latch 1 for latching an 8-bit data word input thereto, a discriminating circuit 2 for outputting a signal corresponding to the number of '1's contained in the latched data word, a true/complement selector 3 for transmission of an output from the latch 1 with or without inversion in accordance with the output of the discriminating circuit 2, a first converter 20 for converting the output of the true/complement selector 3 into a code word of the first group composed of 10 bits containing 5 bits of '1' when a regular data word has been entered, a second converter 21 for converting the same into either a code word of the second group composed of 10 bits containing 2 bits of '1' or a code word of the third group composed of 10 bits containing 8 bits of '1' when a regular data word which cannot be converted by the first converter 20 has been entered, and a data selector 11 for selectively delivering either the output of the first converter 20 or the output of the second converter 21. The first converter 20 is arranged such that if the data word contains 3,4 or 5 bits of '1', it is added with 2 bits of proper unit and if not, a first encoding table 4 provided therein is utilized. The second converter 21 is arranged such that an irregular data word unconvertible using the first converter 20 is detected by a null detector 8 provided therein and then, converted with the use of a second encoding table 7 provided therein.

The digital modulator having the above arrangement shown in FIG. 1, functions as follows.

Figure 2:
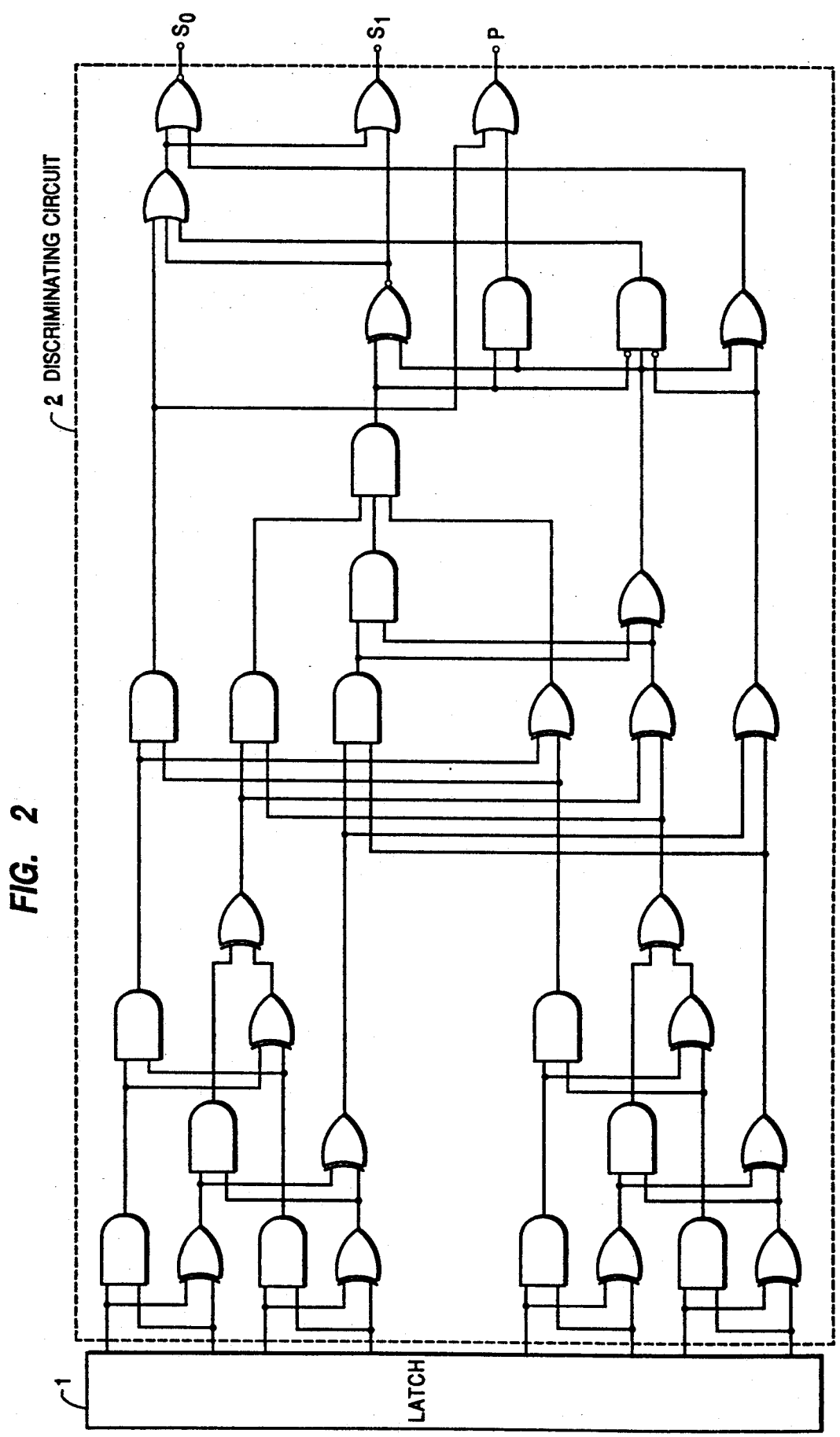
FIG. 2 is a diagram showing an arrangement of a discriminating circuit employed in the digital modulator of FIG. 1.

The latch 1 latches a data word of bit unit entered in 8-bit parallel. The discriminating circuit 2 counts the number of bits '1' contained in the latched data word and, if the counted number is more than 5, will set an output signal P for '1'. If the number is 3, it will set an output signal denoted by $S_0$ and $S_1$ to be '11'; if 4, to be '01'; if 5, to be '00'; if else, to be '10'. FIG. 2 shows an arrangement of the discriminating circuit 2.

The true/complement selector 3 inverts all the bits of the data word supplied from the latch 1 only when the signal P is '1' and, if the signal P is '0', will transmit the output signal of the latch 1 as a signal expressed as b0, b1, ..., and b7. The true/complement selector 3 may consist of exclusive-OR's. As the regular data word is inputted, the signal of b0, b1, ..., b7 from the true/complement selector 3, when the number of bits '1's therein is less than 3, are converted into a 7-bit signal of $S_2$, $S_3$, ..., $S_8$ containing 4 bits '1' in accordance with the first encoding table 4. The first encoding table 4 is arranged, for example, as shown in FIG. 3, consisting of arrays of AND's and OR's. In this example, two signals of b0, b1, ... and b7 expressed as 00000000 and 00000001 respectively are regarded as irregular data words and thus, excluded. The output of the first encoding table 4 is inverted in each bit by a true/complement selector 5 when the signal P is '1'. Then, the output of the true/complement selector 5 is added with a 1-bit signal P denoted as a MSB and becomes an 8-bit signal of ($S_2$, $S_3$, ..., $S_8$ and P) or ($S_2$, $S_3$, ..., $S_8$ and P). This 8-bit signal contains 4 bits of '1' constantly. When the signal of $S_0$ and $S_1$ is '10', the output of the true/complement selector 5 is supplied by a data selector 6 and otherwise, the signal of b0, b1, ... and b7 is outputted. The output of the data selector 6 is summed with a 2-bit signal having $S_0$ and $S_1$ designated as LSB's and becomes a 10-bit signal expressed as x0, x1, ..., x9. The signal of x0, x1, ..., x9 contains 5 bits of '1' constantly. Accordingly, the code word containing 5 bits of '1' can be obtained in 252 ($= {}_{10}C_5$) different kinds, thus providing 252 kinds of regular data words and 4 kinds of irregular data words.

On the other hand, the null detector 8 examines whether or not the upper 7 digits b1, b2, ... and b7 of an output signal of the true/complement selector 3 are all '0' in order to detect an irregular word which is unconvertible using the first converter 20. The irregular data word is then converted by the second encoding table 7 into a 10-bit code word of the second group containing 2 bits '1' with reference to both the LSB b0 of the output signal of the true/complement selector 3 and the signal P supplied from the discriminating circuit 2. FIG. 4 shows an arrangement of the second encoding table 7. The irregular data word can also correspond to a code word of the third group which contains 8 bits '1' and is an inversion of the code word of the second group. There are provided a flip-flop 9 which inverts its state whenever the null detector 8 detects an irregular data word. A true/complement selector 10 directly transmits the output of the second encoding table 7 when the flip-flop 9 is in a particular state and, if in the opposite state, it inverts the same for output. Accordingly, the output of the second converter 21 expressed as y0, y1, ..., y9, is alternately supplied as a code word of the second group and a code word of the third group. This alternative operation cancels disparities of the code words of the second and third groups to reduce drift of DC-components of the channel code.

The data selector 11 is controlled by the output of the null detector 8 and thus, will output the signal of x0, x1, ..., x9 for conversion of the regular data word or the signal of y0, y1, ..., y9 for conversion of the irregular data word. A shift register 12 converts the code words outputted from the data selector 11 into serial form to output a channel code signal.

Figure 5:
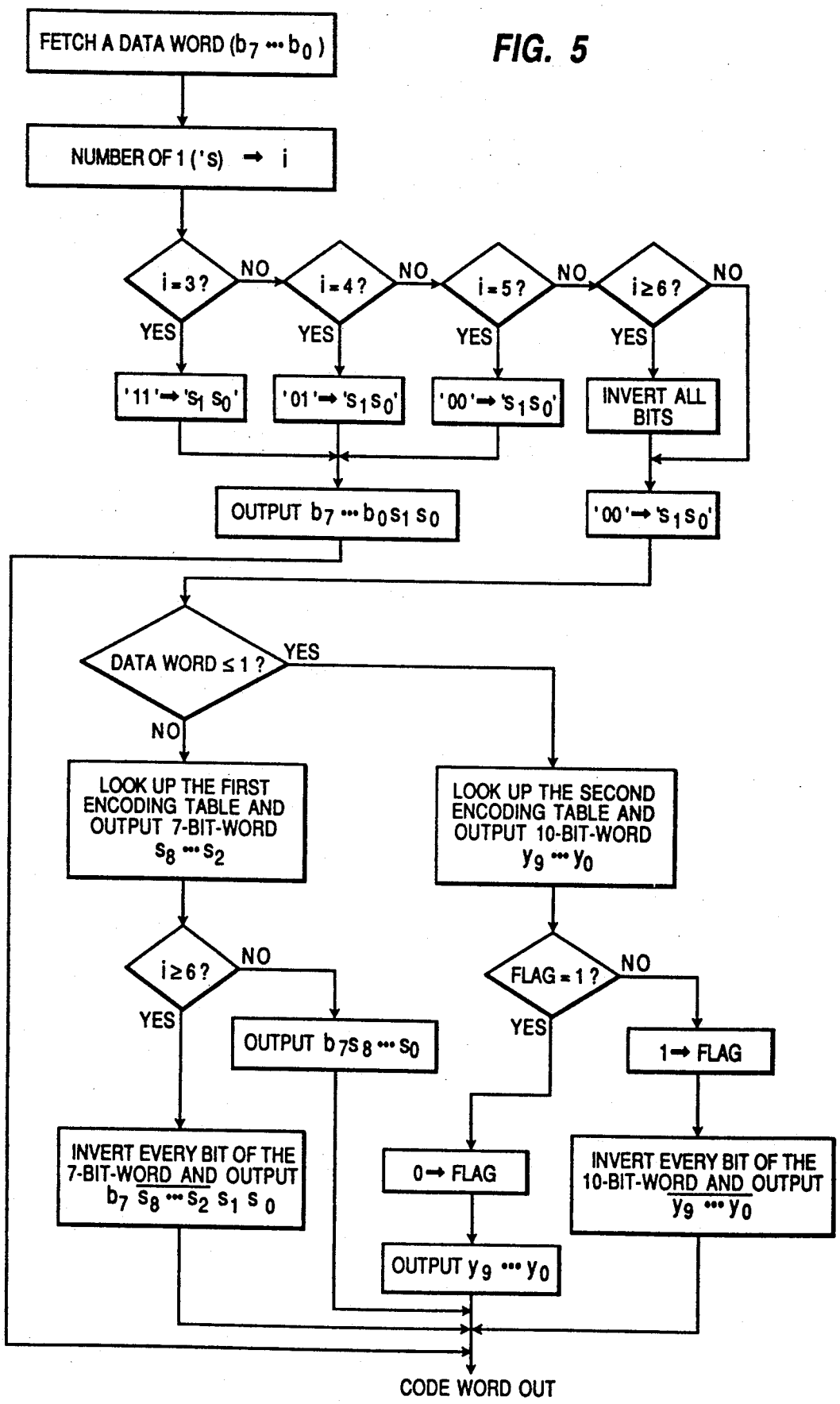
FIG. 5 is a flow chart explaining the operation of the digital modulator of FIG. 1.

FIG. 5 is a flow chart explaining the operation described above.

FIG. 6 shows a process of actual conversion, in which the data words w3 and w5 at the third and fifth from left respectively, are irregular data words. As shown, irregular data words are alternately converted into code words of the second group and of the third group.

As described above, the channel code modulated by the digital modulator of the present invention is obtained by converting an 8-bit data word into a 10-bit unit. Hence, the number of bits '1' in the code word can be identified with ease while the jitter margin increases and the execution of differential detection will be feasible. Also, since DC-free, the reproduction of DC components during demodulation is not needed. The code word of the second group has 2 bits '1' adjoined as '11' where the amplitude is higher so that the level difference between the two bits '1' and the remaining eight bits '0' becomes great and thus, the code word can easily be identified as a unit of the second group. Similarly, the code word of the third group has 2 bits '0' adjoined as '00' so that it can be identified as a unit of the third group.

Although the output signal of $S_0$ and $S_1$ from the discriminating circuit 2 is applied so as to be LSB's of the code word during the conversion of a regular data word in the embodiment, it may be applied to anywhere else.

Another method of separating the irregular words from the regular words may also be appropriate. For example, by excluding 01010101 and 10101010 from the code words of the first group and increasing the irregular data words by two more, each code word can contain '00' and '11'. Then, the envelope of a channel signal will be prevented from becoming small when some particular data words are applied consecutively.

Although the code words of the first and second groups have 2 and 8 bits of '1' respectively, they may contain 1 and 9 bits of '1' respectively. The code words can easily be classified into separate groups by examining the average level difference therebetween.

The demodulation of a channel code modulated by the digital modulator of the present invention will now be described.

Figure 7:
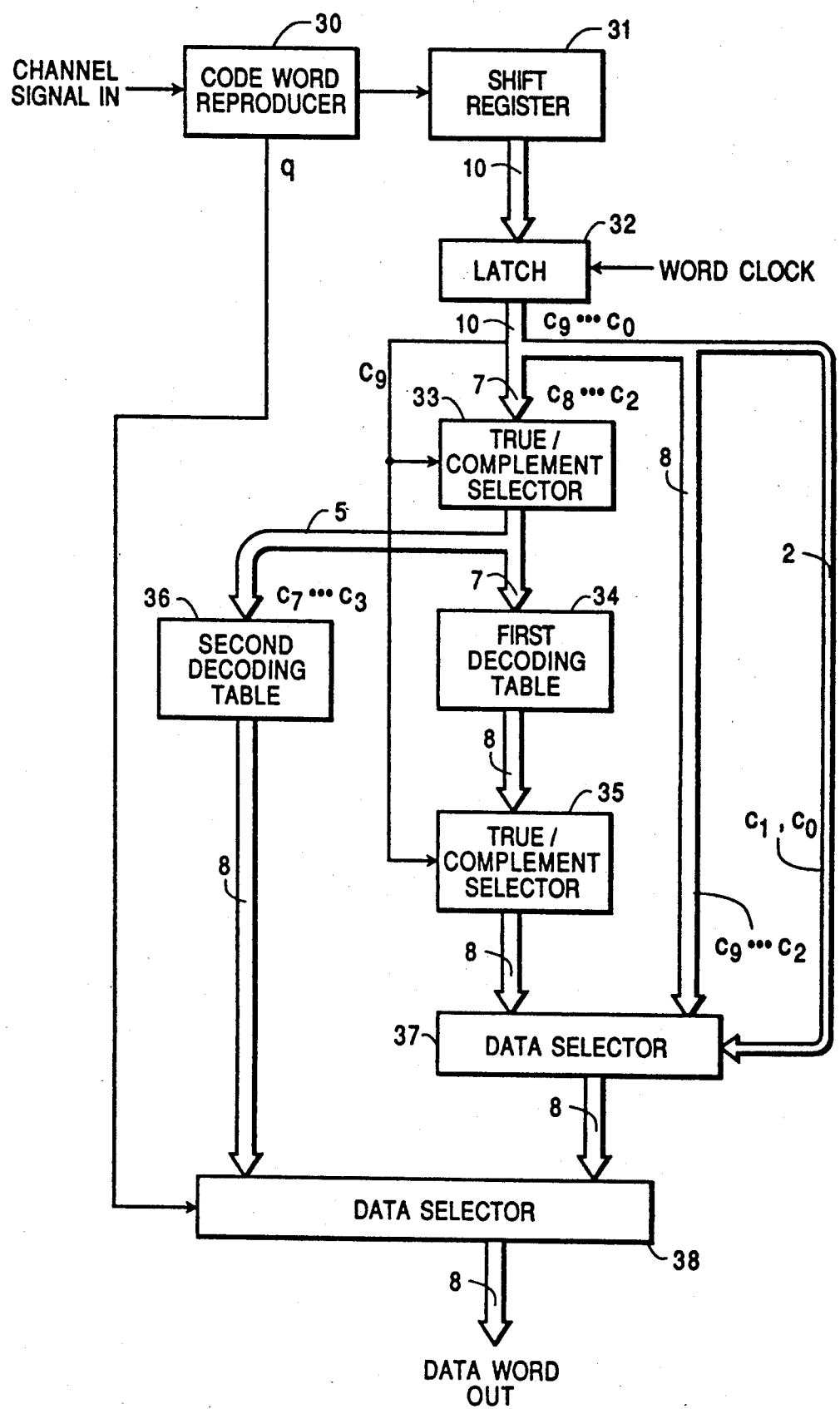
FIG. 7 is a block diagram showing an arrangement of a demodulator for reproduction of the original data from a channel code processed by the digital modulator of FIG. 1.
Figure 8:
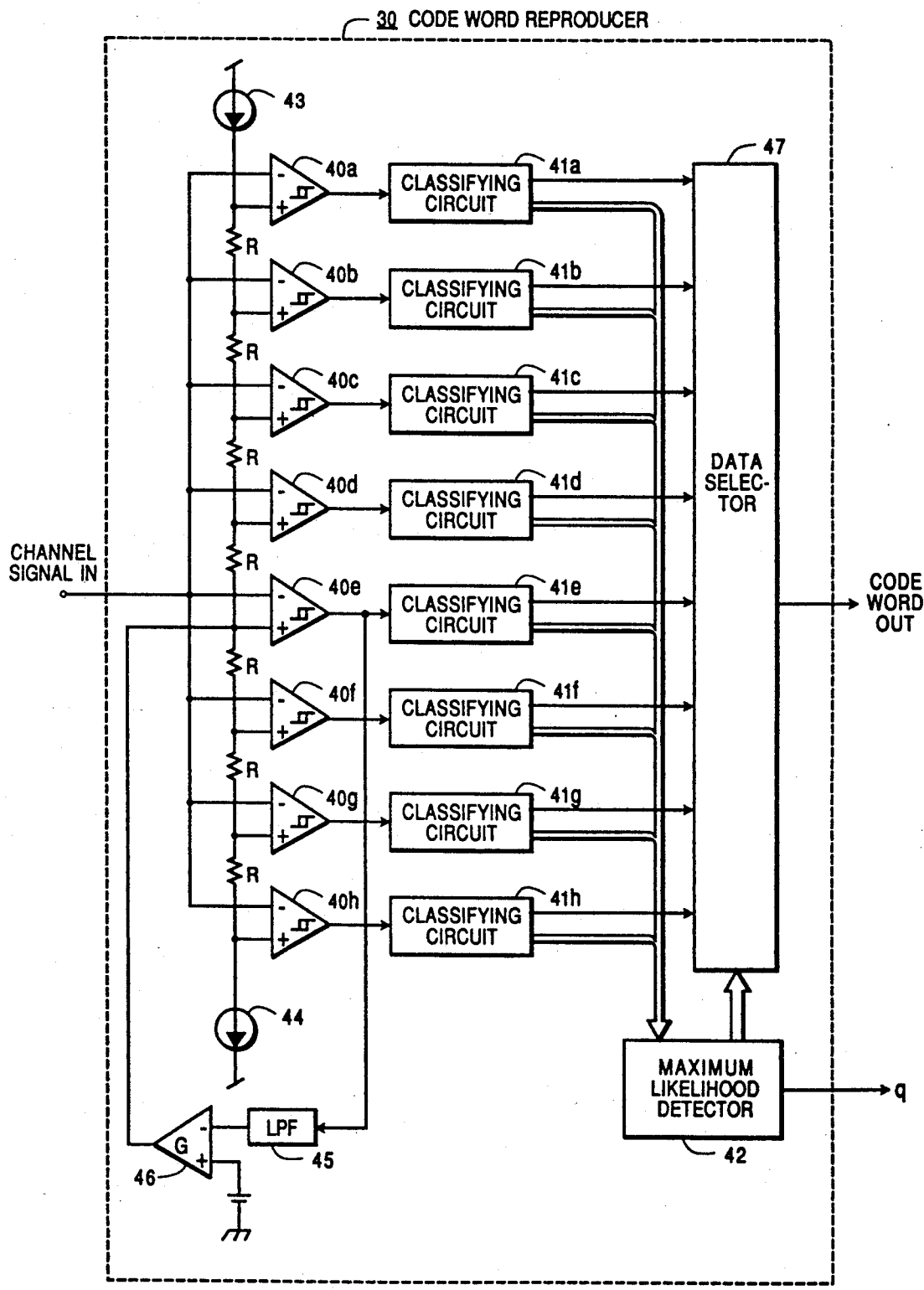
FIG. 8 is a block diagram showing an arrangement of a code word reproducer for the demodulator of FIG. 7.

FIG. 7 is a block diagram showing an arrangement of a demodulator for demodulating the channel code modulated by the digital modulator to obtain an original data word. The demodulator comprises a code word reproducer 30 for reproducing a code word from the channel signal supplied from a transmission path, a shift register 31 for serial-to-parallel conversion of the reproduced code word, a latch 32 for latching the code word converted to a parallel form, a true/complement selector 33 for inverting a 7-bit portion of the code word, expressed as c2, c3, ..., c8, particularly when the MSB represented by c9 is '1', a first decoding table 34 for decoding the output of the true/complement selector 33 to obtain a regular data word, a true/complement selector 35 for inverting the output of the first decoding table 34 when the MSB c9 of the code word is '1', a second decoding table 36 for decoding the output of the true/complement selector 33 to obtain an irregular word, a data selector 37 for selection and delivery of either the output of the true/complement selector 35 or the upper 8-bit portion c2, c3, ..., and c9 of the code word, and a data selector 38 for selection and delivery of either the output of the second decoding table 36 or the output of the data selector 37. As shown in FIG. 8, the code word reproducer 30 includes a plurality of voltage comparators 40a to 40h having different thresholds and a maximum likelihood detector 42 which selects a maximum likelihood signal from the digital signals shaped in waveform by their respective voltage comparators 40a to 40h and delivers it in the form of a code word.

The demodulator having such an arrangement as described above functions as follows.

Figure 9:
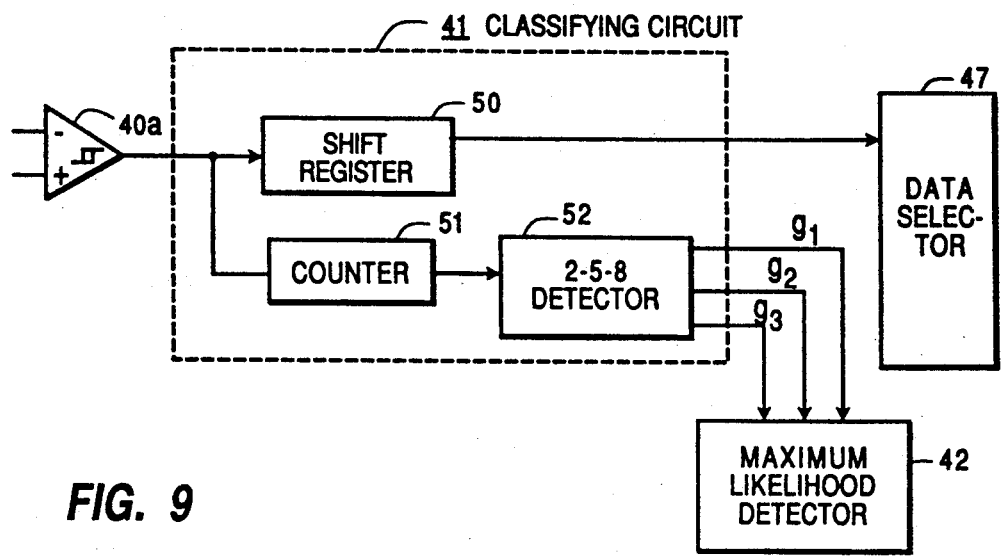
FIG. 9 is a block diagram of a classifying circuit provided in the code word reproducer of FIG. 8.
Figure 12:
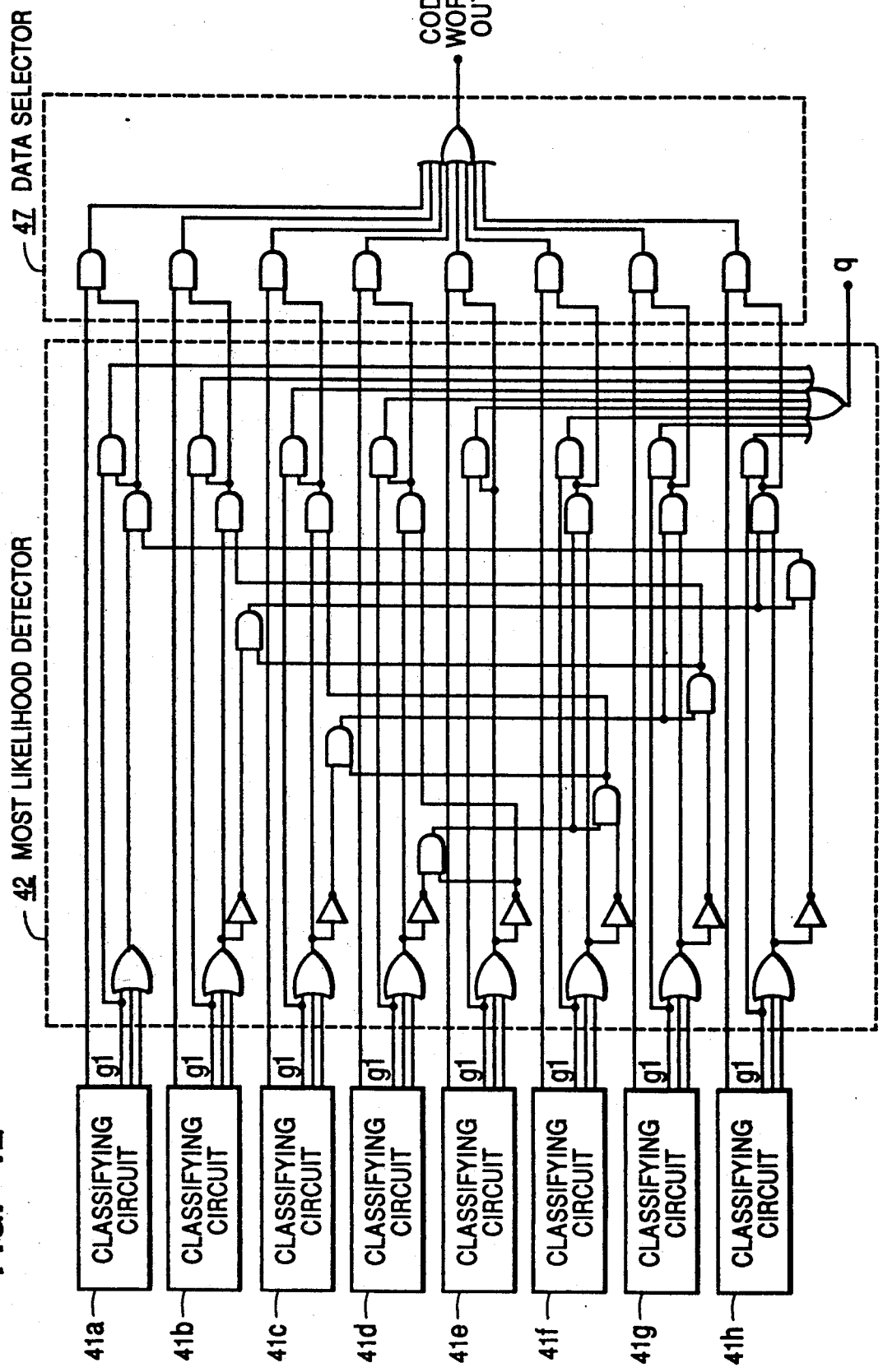
FIG. 12 is a block diagram showing an arrangement of a maximum likelihood detector and a data selector employed in the demodulator of FIG. 7.

The code word reproducer 30 reproduces a code word from the channel signal supplied from the transmission path. More specifically, the code word reproducer 30 shown in FIG. 8 allows the voltage comparators 40a to 40h to shape the channel signal in the waveform according to their respective thresholds which are determined by means of two electric sources 43 and 44 and a plurality of resistors R. The output of the voltage comparator 40e is applied to a low-pass filter 45 to extract a low-frequency component thereof which is in turn amplified by an amplifier 46 in the respect of a difference between the mean voltages of '1' and '0' and transferred in negative feedback to the voltage comparator 40e for its threshold. As the channel code is designed to be DC-free, the threshold of the voltage comparator 40e becomes a mean value of optimum form. The signals from the voltage comparators 40a to 40h are transmitted to classifying circuits 41a to 41h respectively. The classifying circuit 41a is arranged as shown in FIG. 9 in which a shift register 50 temporarily stores a digital signal from the voltage comparator 40a while a counter 51 counts the number of '1' bits in each code word separately. Also, when the count of the counter 51 is 2, 5, or 8, its output signal g2, g1, or g3 is set to be '1' by a 2-5-8 detector 52. The signals g1, g2, and g3 represent that the code word stored in the shift register 50 is of the first group if g1='1', of the second group if g2='1', and of the third group if g3='1'. The other classifying circuits 41b to 41h are the same in arrangement as the classifying circuit 41a. The maximum likelihood detector 42 selects one of the classifying circuits which outputs a signal g1, g2 or g3 set to be '1', and controls a data selector 47 to output a code word from the selected classifying circuit. More specifically, the maximum likelihood detector 42 selects a classifying circuit which has a threshold most approximate to that of the classifying circuit 41e. FIG. 12 shows an example of the maximum likelihood detector 42 and a data selector 47. The maximum likelihood detector 42 can also use a logic functioning a decision of majority.

Then, the maximum likelihood detector 42 sets an output signal q to '1' when the signal g2 or g3 from the selected classifying circuit is '1'. In other words, setting of q='1' indicates that the reproduced code word shall be decoded to a regular data word. In this way, the channel signal can be converted to reproduced code words with the code word reproducer 30.

Figure 10:
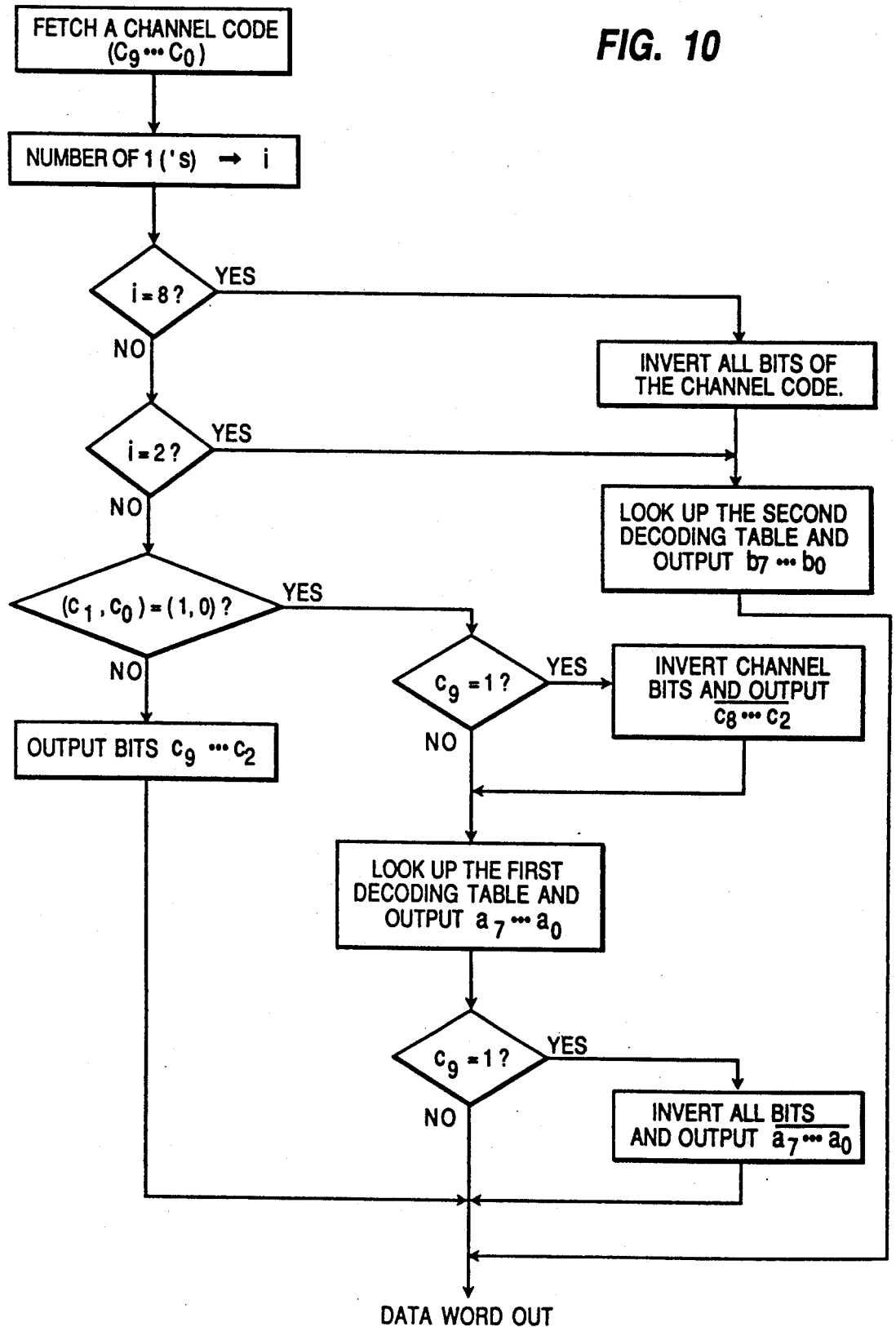
FIG. 10 is a flow chart showing the decoding of a code word to obtain a data word with the demodulator of FIG. 7.

The reproduced code word is then converted from serial form to parallel form by the shift register 31 and latched with the latch 32. When the MSB c9 of the code word is '1', the true/complement selector 33 inverts c2, c3, ..., and c8 of the code word. The output of the true/complement selector 33 is then decoded by the first decoding table 34 to obtain 8-bit word. The 8-bit word from the first decoding table 34 is inverted by the true/complement selector 35 when the MSB c9 of the code word is '1'. The data selector 37 outputs the signal from the true/complement selector 35 when the unit of c1 and c0 in the code word is '10' and otherwise, the upper 8-bit portion of the code word from c9 to c2. The output of the true/complement selector 33 is decoded by the second decoding table 36 to obtain an irregular data word. The data selector 38 then passes the signal from the second encoding table 36 when the signal q is '1' and if not, the signal from the data selector 37. As a result, the code word can be decoded to a data word. FIG. 10 is a flow chart showing the abovementioned procedure.

Figure 11:
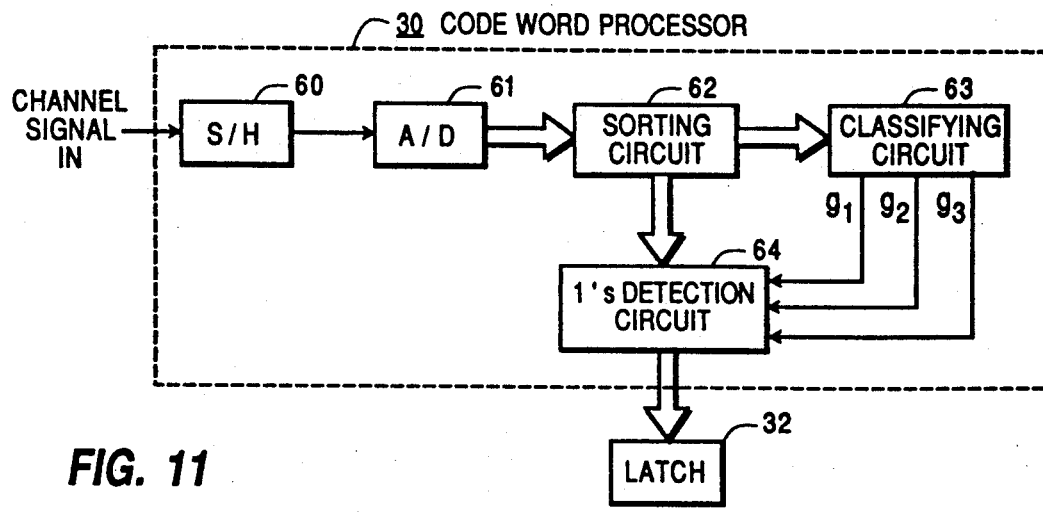
FIG. 11 is a block diagram of another code word reproducer for the demodulator of FIG. 7.

It will be understood that the code word reproducer 30 is not limited to the arrangement shown in FIG. 8. For example, shown in FIG. 11 is another arrangement of the code word reproducer 30, in which the channel signal is sampled by a sample and hold circuit 60 in synchronism with the channel bit and the sampled output is then converted by an analog-to-digital converter (A/D) 61 into a digital value. The digital values are in turn sorted by a sorting circuit 62 from the largest to the smallest. When the difference between the second and third sorted results exceeds a predetermined value, the output signal g2 is set to '1' by a classifying circuit 63; when the difference between the eighth and ninth exceeds a predetermined value, the output signal g3 is set to '1'; or else, the signal g1 is set to '1'. Then, if g2, g1, or g3 is '1', the upper 2-bit, 5-bit, or 8-bit portion of a digital value is designated as '1' by a 1's detection circuit 64. In this case, the shift register 31 can be omitted.

In the embodiment, duplication of the code words of the second and third groups corresponding to an irregular data word and their reciprocal usage contribute to making the channel code DC-free. However, because the demodulator of the present invention performs reproduction of code words even if the DC component varies, the DC-free code is unnecessary and the process may be possible, for example, with the absence of a code word of the third group.

Also, the arrangement of the conversion table is not limited to the embodiment and may be modified for variation.

We claim:
1. A digital modulator for converting an input data train to a coded data train, comprising:
   grouping means for separating the input data train into data words each being composed of M bits;
   encoding means for converting each of the data words into a corresponding one of a plurality of code words each being composed of N bits, where $N > M$, and each containing a specific number of '1' bits, said plurality of code words being classified into at least two groups such that the number of '1' bits contained in each code word in each of said groups is the same and such that the number of '1' bits contained in each code word in one of said groups is different by at least 3 from the number of '1' bits contained in each code word in another of said groups; and
   transmitting means for transmitting the code word outputted from the encoding means in the form of a serial channel code.

2. A digital modulator as defined in claim 1 wherein M is 8, N is 10, and the number of '1' bits contained in the code word is 2 or 5.

3. A digital modulator as defined in claim 2, wherein '1' bits in a code word having two '1' bits are adjoined to each other.

4. A digital modulator as defined in claim 1 wherein M is 8, N is 10, and the number of '1' bits contained in the code word is 5 or 8.

5. A digital modulator as defined in claim 1, wherein M is 8, N is 10, and the number of '1' bits contained in the code word is 2, 5 or 8; and wherein said encoding means converts some of the data words each to one of a code word having two '1' bits and a code word having eight '1' bits so as to reduce the DC component of the channel code, and converts the remaining data words each to a code word having five '1' bits.

6. A digital modulator as defined in claim 5, wherein '1' bits in a code word having two '1' bits are adjoined to each other while '0' bits in a code word having eight '1' bits are adjoined to each other.

7. A digital modulator as defined in claim 1, wherein M is 8, N is 10, and the number of '1' bits contained in the code word is 1, 5 or 9; and wherein said encoding means converts some of the data words each to one of a code word having one '1' bit and a code word having nine '1' bits so as to reduce the DC component of the channel code, and converts the remaining data words each to a code word having five '1' bits.

8. A digital modulator as defined in claim 1, wherein M is 8, N is 10, and said encoding means converts a data word which contains 3, 4 or 5 '1' bits into a code word by adding additional 2 bits to a specific position thereof, the additional 2 bits being designated as '1' and '1' when the data word contains 3 '1' bits, '1' and '0' when the data word contains 4 '1' bits, and '0' and '0' when the data word contains 5 '1' bits.

9. A demodulator for reproducing data words each being composed of M bits from a channel signal formed of a serial train of code words each being composed of N bits, where N>M, and containing a specific number of '1' bits, said code words being classified into at least two groups such that the number of '1' bits contained in each code word in each of said groups is the same and such that the number of '1' bits contained in each code word in the number of '1' bits contained in each code word in another of said groups, comprising:
 a plurality of voltage comparating means having different thresholds from one another for waveform shaping the channel signal with the respective thresholds;
 a plurality of counting means which are respectively coupled to the plurality of voltage comparating means and each of which is for separating an output of a corresponding one of the plurality of voltage comparating means into N-bit words and counting the number of '1' bits contained in each N-bit word;
 maximum likelihood detecting means for identifying as a code word one having a maximum likelihood from N-bit words in each of which the number counted by the counting means corresponds to one of the predetermined numbers; and
 decoding means for decoding the code word identified by the maximum likelihood detecting means to recover a data word.

10. A demodulator as defined in claim 9, wherein the maximum likelihood detecting means recognizes a threshold of the voltage comparating means which is most approximate to a reference value as a likelihood.

11. A demodulator for reproducing data words each being composed of M bits from a channel signal formed of a serial train of code words each being composed of N bits, where N>M, and containing a specific number of '1' bits, said code words being classified into at least two groups such that the number of '1' bits contained in each code word in each of said groups is the same and such that the number of '1' bits contained in each code word in one of said groups is different by at least 3 from the number of '1' bits contained in each code word in another of said groups, comprising:
 sampling holding means for sampling the channel signal;
 analog to digital converter means for converting the sampled values into digital values;
 sorting means for arranging the digital values in order from the largest value to the smallest value;
 classifying means for computing a difference between an i-th largest value and an i+1th largest value of the digital values arranged by the sorting means, where i is one of said predetermined numbers, and determining i as the number of '1' bits in the code word when said difference exceeds a specified value; and
 code word reproducing means for reproducing a code word by recognizing i bits as '1' in the order from the largest likelihood in the digital values.

* * * * *